United States Patent [19]

Choi

[11] Patent Number: 4,860,257

[45] Date of Patent: Aug. 22, 1989

[54] LEVEL SHIFTER FOR AN INPUT/OUTPUT BUS IN A CMOS DYNAMIC RAM

[75] Inventor: Yun H. Choi, Inchon, Rep. of Korea

[73] Assignee: Samsung Semiconductor and Telecommunications Co., Ltd., Gumi, Rep. of Korea

[21] Appl. No.: 125,682

[22] Filed: Nov. 25, 1987

[30] Foreign Application Priority Data

Nov. 30, 1986 [KR] Rep. of Korea ............... 86-10238

[51] Int. Cl.$^4$ ............................................. G11C 7/00
[52] U.S. Cl. .................................. 365/189.11; 365/203
[58] Field of Search ................ 365/189, 190, 202, 203

[56] References Cited

U.S. PATENT DOCUMENTS 4,618,785 10/1986 Van Tran ........................... 365/190

Primary Examiner—Joseph A. Popek
Attorney, Agent, or Firm—Cushman, Darby & Cushman

[57] ABSTRACT

A level shifter for an input/output bus in a CMOS dynamic RAM employs a first and second PMOS transistor. The first and second PMOS transistors are connected to and cut off a current flow between a pair of input/output lines and a pair of input/output sense amplifier input lines which are connected to input/output sense amplifiers. First and second inverters are included for each of the first and second PMOS transistors, each inverter has an input for receiving a signal for a selection of the input/output line pair and has a respective output which is connected to a corresponding gate and drain of the first and second PMOS transistors.

4 Claims, 3 Drawing Sheets

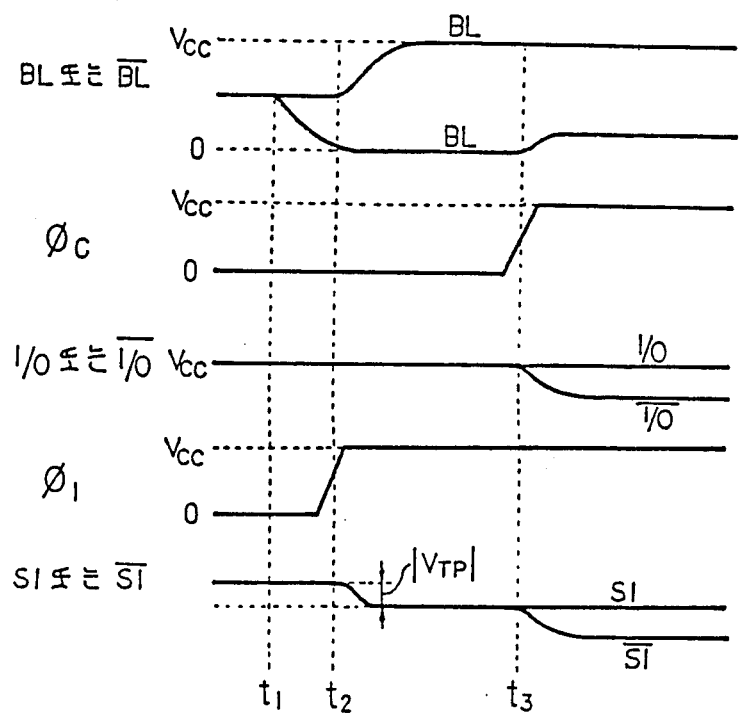

LEVEL SHIFTER FOR AN INPUT/OUTPUT BUS IN A CMOS DYNAMIC RAM

DETAILED DESCRIPTION OF THE INVENTION

This information relates to a level of shift circuit for the input-output bus in semiconductor memory devices, and more particularly to a level shift circuit of the input-output bus of an input-output circuit of CMOS DRAM adopting the static column mode.

Recently, semiconductor manufacturing companies are fabricating CMOS DRAM that have the features of low-power dissipation, stable operating characteristics and compact design of user-oriented operation modes such as Fast Page Mode and Static Column Mode by reducing the number of circuits in the peripheral clock generating circuit.

It is a well-known design technique of CMOS DRAM that dynamic operation of NMOS DRAM is employed in the circuit related to Row Address Strobe ($\overline{RAS}$) signal and that static operation of CMOS is employed in the circuit related to Column Address Strobe ($\overline{CAS}$) signal. The most important part related to column address signal is the input-output sense amp and its peripheral circuitry.

Therefore, an input-output sense amplifier employing static operation and a single-ended output differential amplifier using CMOS transistors is usually adopted for stable operation.

The main purpose of said input-output sense amplifiers in to amplify the difference signal between I/O and $\overline{I/O}$ in the input-output bus, which is restricted to below 1 volt for fast operation of static column mode and page mode.

It is the characteristic of DRAM that precharge level of power supply voltage Vcc in the input-output bus I/O, $\overline{I/O}$ reduces problems such as voltage spikes, etc.

However, said input-output sense amplifier has a very poor sensing characteristic at the level of power supply voltage Vcc, because the input transistor of said differential amplifier undergoes linear operation at the bias level of power supply voltage Vcc. Therefore, it is necessary that the level shifted signal of said input-output bus I/O and $\overline{I/O}$ should be applied to the input of a differential amplifier of said input-output sense amp, in order for the input transistor of said differential amplifier to amplify the small voltage difference between input-output bus I/O and $\overline{I/O}$ with large gain in the saturation region.

Figure 1:
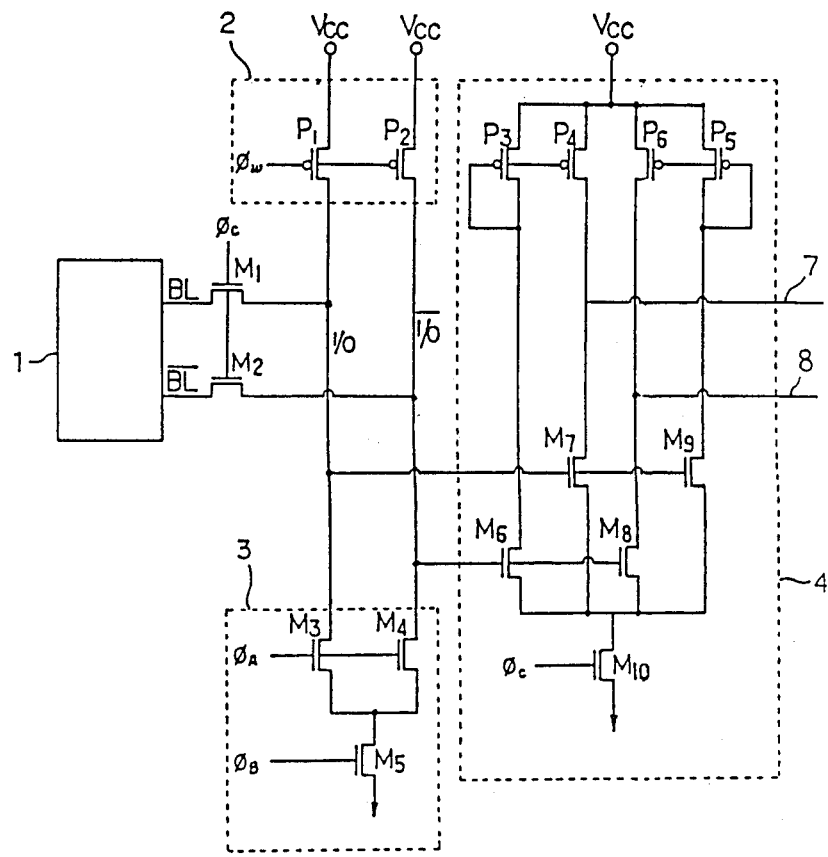
FIG. 1 is an input-output circuit diagram of conventional CMOS DRAM.

In order to accomplish said purpose, the circuit 3 of FIG. 1 is usually used as a level-shift circuit, comprising a pair of bit lines BL and $\overline{BL}$ connected to many memory cells not drawn here; some amplifier 1 is connected to said bit lines; NMOS transistors M1 and M2 deliver information of said bit lines BL and $\overline{BL}$ amplified by sense amplifier 1 to input-output bus I/O and $\overline{I/O}$ through conduction due to pulse output $\phi_c$ provided from column address decoder; precharge circuit 2 precharges input-output bus I/O and $\overline{I/O}$ to power supply voltage Vcc by pulse $\phi_w$ maintains a low state except during the write cycle; level shift circuit 3 shifts down the voltage of said input-output bus I/O and $\overline{I/O}$ by clock $\phi_a$, $\phi_b$ that goes into a high state in the active cycle; and input-output sense amp 4 amplifies the voltage difference on said bus I/O and $\overline{I/O}$.

Input-control sense amp 4 is a conventional CMOS differential amplifier, composed of NMOS transistors M6–M10 and PMOS transistors P3–P6, and amplifies data on said bus I/O and $\overline{I/O}$ when the pulse $\phi_c$ is in a high state.

Two pairs of PMOS transistors P3,P4 and P5,P6 are used as loads for two pairs of NMOS transistors M6, M7 and M8, M9 which are used as constant current sources, and lines 7 and 8 are output lines.

Therefore, because the parasitic capacitance of input-output bus I/O and $\overline{I/O}$ is large in the conventional level-shift circuit as shown in FIG. 1, the size of NMOS transistors M3–M5 should be large in order to shift rapidly down the voltage level of said bus I/O and $\overline{I/O}$ in the fast operation modes, and this causes a problem of large power dissipation.

It is the principal object of this invention to provide a device to shift voltage level of an input-output bus, which makes a input-output sense amp operate in a large-gain region.

Another object of this invention is to provide an input-output level-shift device that provides access to data in a short time in fast operation modes.

Another object of this invention is to provide a level-shift device of low power dissipation.

It is a characteristic of this invention to provide a circuit that readily acts on the voltage variation on an input-output bus line of a large parasitic capacitance and that shifts down the voltage level of said bus line by a finite amount and that makes an input-output sense may operate in its high-gain region.

Figure 2:
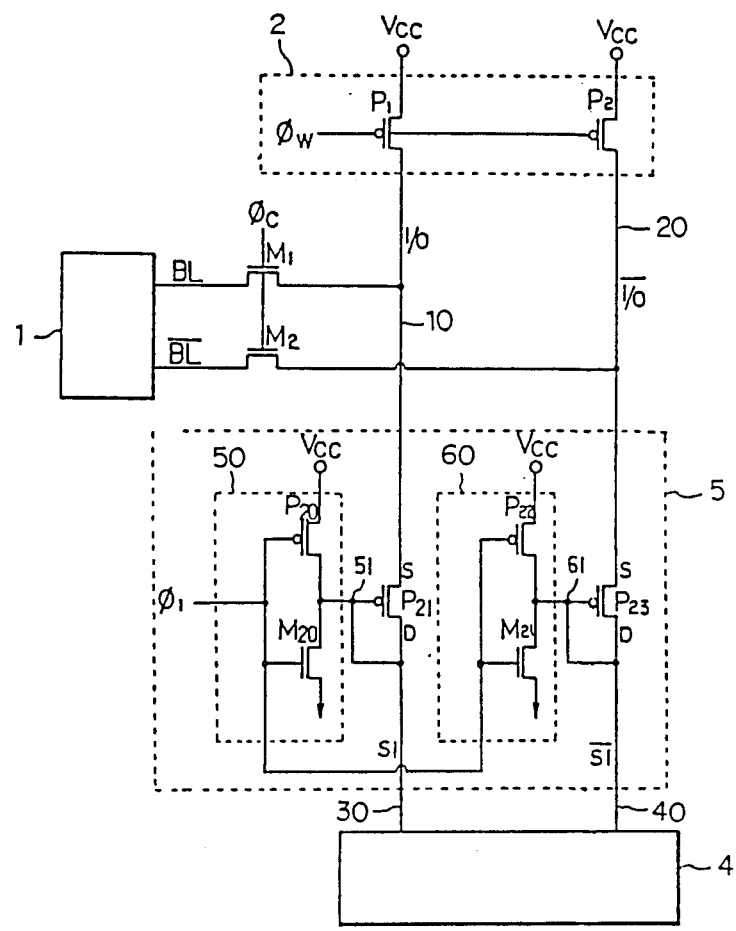
FIG. 2 is an input-output circuit diagram of CMOS DRAM of this invention.

Referring to the figures, a detailed explanation of this invention will be given below. FIG. 2 is a diagram of a CMOS DRAM level shift circuit according to this invention which has the same circuit as FIG. 1 except the level-shift circuit 5 of this invention, with reference numbers being the same as FIG. 1.

Also the diagram shown in FIG. 2 has only one sensing amplifier 1, input-output bus I/O and $\overline{I/O}$, and input-output sense amp 4, but it should be noted that many groups of sensing amplifiers, input-output buses I/O and $\overline{I/O}$, and input-output sense amps are included in one DRAM chip.

In the level shift circuit 5 of FIG. 2, pulse $\phi_1$, which selects an input-output bus line, is applied on gates of PMOS transistor $P_{20}$ and $P_{22}$ and NMOS transistor $M_{20}$ and $M_{22}$ which form inverter 50 or 60. Outputs of said inverters 50 and 60 are inputs to gates of PMOS transistors $P_{21}$ and $P_{23}$, and are connected to input lines 30 and 40 of input-output sense amp. Sources S of said PMOS transistors $P_{21}$ and $P_{23}$ are connected to input-output bus line 10 and 20, respectively, and drains D of said PMOS transistors $P_{21}$ and $P_{23}$ are connected to input line 30 and 40 of input-output sense amp, respectively.

In the level shift circuit 5, PMOS transistors $P_{21}$ and $P_{23}$ are transistors having a large $\beta$-ratio (or size) and NMOS transistors $M_{20}$ and $M_{21}$ are transistors having a small $\beta$-ratio (or size).

Figure 3:
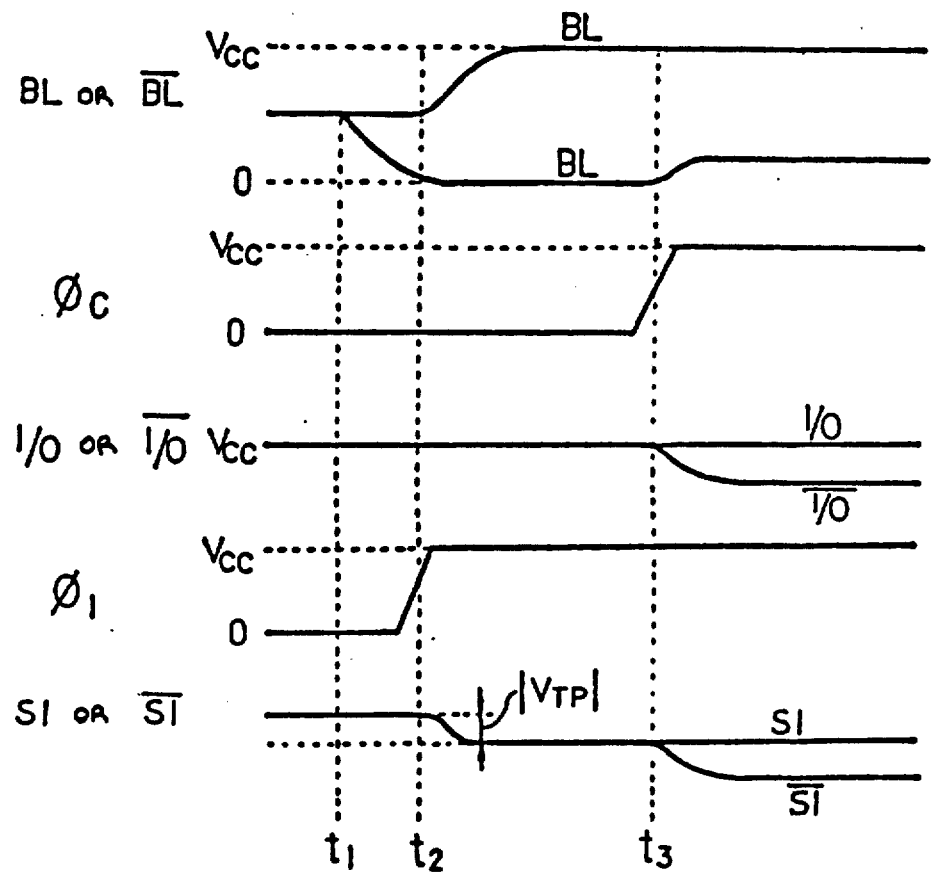
FIG. 3 is a timing diagram of FIG. 2.

FIG. 3 is a timing diagram of the CMOS DRAM input-output circuit of FIG. 2.

Hereinafter, the operation of the circuit of FIG. 2 is explained in detail by reference to FIG. 3.

Clock $\phi_w$ of precharge circuit 2 is in a low state except during the write cycle of an active cycle, as mentioned before.

Therefore, if $\phi_w$ is low the input-output lines 10 and 20 are at a state of power supply voltage Vcc.

As in the operative of a conventional DRAM, the word line goes to an active state due to an address output from the row address decoder in the active cycle of low $\overline{RAS}$, and sense amplifier 1 starts its sensing action at time $t_1$ of FIG. 3.

FIG. 3 is a plot under the assumption of ½ Vcc operation of the bit line. At time $t_2$ restoring action occurs and the bit line is charged to a state of power supply voltage Vcc.

If it is assumed that the bit line BL read a "1" stored on the memory cell by said address selection so that charge distribution has occurred, bit line BL goes to Vcc, bit line $\overline{BL}$ goes to 0 volt, and a voltage difference between them occurs (it diverges from restoration).

Now assume input-output line pair 10 and 20 is selected and clock $\phi_1$ goes to "1" state (Vcc volt).

Therefore, potential on the output node point 51 of first inverter 50 and on the output node point 61 of second inverter 60 goes down due to conduction of NMOS transistors $M_{20}$ and $M_{21}$, respectively.

The potentials of node point 51 and 61 goes down from precharged voltage Vcc of input-output bus line 10 and 20 by an amount of $|V_{TP}|$, which is absolute value of threshold voltage $V_{TP}$ of PMOS transistors $P_{21}$ and $P_{23}$.

Then, current flows through input-output bus line 10 and 20, source, drain of PMOS transistors $P_{21}$ and $P_{23}$, node points 51 and 61, and NMOS transistors $M_{20}$ and $M_{21}$, respectively, and potentials of node points 51 and 61 all becomes nearly $Vcc - |V_{TP}|$.

Here, NMOS transistors $M_{20}$ and $M_{21}$ can be made small since input line SI and $\overline{SI}$ (or 30 and 40) of input-output sense amp have small parasitic capacitance (about 0.2 pf), and PMOS transistors $P_{21}$ and $P_{23}$ are made larger than said transistors $M_{20}$ and $M_{21}$ in order to make the potential of node points 51 and 60 be about $Vcc - |V_{TP}|$ by voltage distribution from current flowing through the circuit as mentioned before.

Therefore, if it is assumed that input line 30 and 40 (or SI and $\overline{SI}$) of input-output sense amp is in a state of voltage level Vcc in common with input-output bus line 10 and 20, then after time $t_2$ of FIG. 3 the potential of said lines SI and $\overline{SI}$ go down by an amount of said threshold voltage $|V_{TP}|$.

Like the operation of a conventional DRAM, clock $\phi_c$ output from column address decoder, not shown in the figure, goes to a high state at time $t_3$ of FIG. 3 and NMOS transistors $M_1$ and $M_2$ all go into conduction state.

Therefore, as shown in FIG. 3, because bit line BL is in Vcc state and bit line $\overline{BL}$ is in 0 volt state, after time $t_3$ input-output bus line 10 (or I/O) maintains Vcc state, said bit line $\overline{BL}$ shows a small voltage increment 70, as shown in FIG. 3, from the charging from voltage Vcc by parasitic capacitance of input-output bus line 20 (or $\overline{I/O}$), and input-output bus line I/O loses charges.

Therefore, potential state of input line SI and $\overline{SI}$ of Input-output sense amp changes from the state level-shifted by said threshold voltage $|V_{TP}|$ from potential state of said bus line I/O and $\overline{I/O}$ by an amount of potential change of $\overline{I/O}$ due to said potential state of input-output bus line I/O and $\overline{I/O}$ after time $t_3$ in the same way as mentioned above, and said voltage is amplified differentially with high amplification ratio by input-output sense amp 4 operating in its saturation (high gain) region as mentioned before.

So, low power dissipation results from the fact that the current-conducting circuit is connected through very small transistors $M_{20}$ and $M_{21}$ when clock $\phi_1$ is active and that current-conducting circuit disappears when clock $\phi_1$ is not active.

And voltage spike characteristics is improved because the charged potential of said input-output bus line 10 and 20 follows power supply voltage Vcc immediately through PMOS precharge transistors $P_1$ and $P_2$ when the power supply voltage Vcc goes up or down.

Therefore, maximum-gain operation of the input-output sense amp in respect to margin of power supply voltage variation is ensured by the fact that even under voltage spikes, the input voltage to input-output sense amp is $Vcc - V_{TH}$ level-shifted by $V_{TH}$ from power supply voltage Vcc after variation.

As mentioned before, the advantages of this invention are the immunity to voltage spikes in the input-output circuit, reduced power dissipation, minimized effect of voltage spikes on input-output bus line, and assurance of maximum-gain operation of input-output sense amp.

I claim:

1. A level shifter for an input/output bus in a CMOS dynamic RAM having a plurality of bit line pairs, input/output line pairs, input/output sense amplifiers, and precharge voltage supply circuits, the level shifter comprising:

separating means connected between each input/output line pair and each corresponding input/output sense amplifier input line pair, the input/output sense amplifiers input line pairs being connected to corresponding input/output sense amplifiers, the means separating a capacitive load between the input/output sense amplifier input line pairs; and a voltage maintaining means connected to said separating means for preserving a predetermined voltage difference from a supply voltage between the input/output line pairs and their corresponding input/output sense amplifier input line pairs.

2. A level shifter according to claim 1 wherein said separating means comprises first and second PMOS transistors for each input/output line pair, the sources and drains of the first and second PMOS transistors being connected to each corresponding input/output line pair and input/output sense amplifier input line pair, respectively, and said voltage maintaining means comprises first and second inverters for the corresponding first and second PMOS transistors, each said inverter having an input for receiving a signal for the selection of one input/output line pair and having a respective output which is connected to a corresponding gate and a drain of said each of first and second PMOS transistors.

3. A level shifter according to claim 1 wherein said predetermined voltage difference for said supply voltage is the absolute value of the threshold voltage for said each of first and second PMOS transistors.

4. A level shifter according to claim 1 wherein the magnitude of said predetermined voltage difference for said supply voltage is determined by the ratio of transistor sizes between the PMOS transistor of said separating means and a grounded NMOS transistor of said voltage maintaining means.

* * * * *

UNITED STATES PATENT AND TRADEMARK OFFICE
CERTIFICATE OF CORRECTION

PATENT NO. : 4,860,257　　　　　　　　　　　　　　　　Page 1 of 2

DATED　　　 : August 22, 1989

INVENTOR(S) : Yun Ho Choi

It is certified that error appears in the above-identified patent and that said Letters Patent is hereby corrected as shown below:

Please change:

"Drawing Section, FIG. #3 (sheet 3 of 3)"　　　to

---Drawing Section, FIG. #3 (sheet 3 of 3)

(Korean word which inadvertently appeared on Fig. 3 three times, to the English equivalent). ---

Signed and Sealed this

Twenty-eighth Day of August, 1990

Attest:

HARRY F. MANBECK, JR.

*Attesting Officer*　　　　　　　*Commissioner of Patents and Trademarks*